(12) United States Patent  (10) Patent No.: US 6,633,999 B1
Lee  (45) Date of Patent: Oct. 14, 2003

(54) INTEGRATED CIRCUIT WITH ON-CHIP DATA CHECKING RESOURCES

(75) Inventor: Wen-Chieh Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/475,329

(22) Filed: Dec. 30, 1999

(51) Int. Cl.$^7$ ............................................. G11B 21/00
(52) U.S. Cl. ..................... 714/30; 714/722; 714/768; 714/5
(58) Field of Search .................... 714/30, 719, 738, 714/722, 5, 768; 702/117

(56) References Cited

U.S. PATENT DOCUMENTS

| 4,876,684 | A | * | 10/1989 | Guntheroth | 714/719 |
|---|---|---|---|---|---|
| 5,339,398 | A | * | 8/1994 | Shah et al. | 711/216 |
| 5,380,998 | A | * | 1/1995 | Bossen et al. | 714/735 |
| 5,553,238 | A | * | 9/1996 | Nelson | 714/54 |
| 5,704,033 | A | * | 12/1997 | Park | 714/30 |
| 5,742,616 | A | * | 4/1998 | Torreiter et al. | 714/732 |
| 5,748,886 | A | * | 5/1998 | Hijii | 714/49 |
| 5,797,023 | A | * | 8/1998 | Berman et al. | 713/324 |
| 5,798,653 | A | * | 8/1998 | Leung, Jr. | 324/760 |
| 6,081,908 | A | * | 6/2000 | Yamada | 714/30 |
| 6,105,155 | A | * | 8/2000 | Cheng et al. | 365/201 |
| 6,119,248 | A | * | 9/2000 | Merkin | 714/52 |
| 6,353,563 | B1 | * | 3/2002 | Hii et al. | 712/227 |
| 6,367,042 | B1 | * | 4/2002 | Phan et al. | 714/733 |
| 6,399,283 | B1 | * | 6/2002 | Hoshi | 711/216 |
| 6,415,406 | B1 | * | 7/2002 | Kaiser et al. | 714/30 |
| 6,415,409 | B1 | * | 7/2002 | Rhodes et al. | 714/30 |
| 6,467,056 | B1 | * | 10/2002 | Satou et al. | 714/720 |
| 6,510,527 | B1 | * | 1/2003 | Woerner et al. | 714/5 |

* cited by examiner

*Primary Examiner*—Scott Baderman
*Assistant Examiner*—Anne L. Damiano
(74) *Attorney, Agent, or Firm*—Mark A. Haynes; Haynes Beffel & Wolfeld LLP (57) ABSTRACT

An integrated circuit with on-chip resources to support the testing of data stored on the integrated circuit includes logic to compute a check code using data, or a combination of data and addresses, of a particular data set stored on the device. The check code produced using the stored version of the data set is compared with a test code produced using a correct version of the data set, to indicate whether the correct data set was successfully stored on the device. An on-chip store holds the code produced using the correct version, and an on-chip comparator is used to produce a flag indicating the success or failure of the test. During manufacturing of the device, the memory tester simply tests the flag.

40 Claims, 7 Drawing Sheets

INTEGRATED CIRCUIT WITH ON-CHIP DATA CHECKING RESOURCES

BACKGROUND OF THE INVENTION

1. Field of the Invention

The present invention relates to integrated circuits having non-volatile memory, such as read-only memory ("ROM"); and more particularly to on-chip resources supporting the manufacturing and testing of data stored in the non-volatile memory.

2. Description of Related Art

Figure 1:
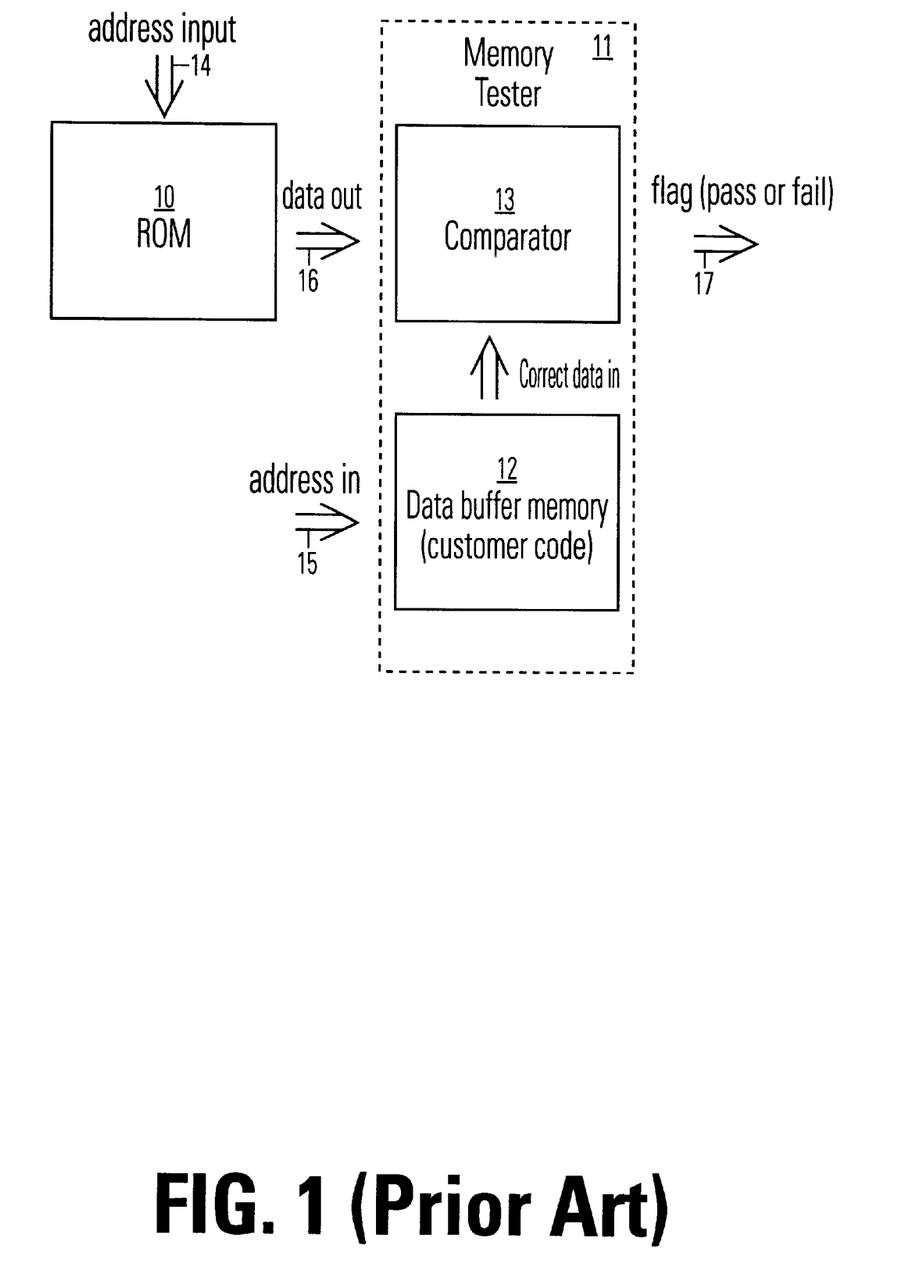
FIG. 1 is a system diagram illustrating the testing environment of the prior art.

The manufacturing of integrated circuit devices including on-chip non-volatile memory, such as mask ROM, includes a step of testing the data stored in the non-volatile memory. Thus, after the data is stored in the non-volatile memory, that data is downloaded into a memory tester which includes a comparator and a buffer memory storing a correct copy of the data. This environment is schematically illustrated in FIG. 1, for the case in which the integrated circuit consists of a ROM device. Thus, as shown in FIG. 1, a ROM 10 being manufactured is coupled to a memory tester 11. The memory tester 11 includes a large data buffer memory 12 and a comparator 13. Addresses are supplied as indicated by arrow 14 to the ROM, and as indicated by arrow 15 to the memory tester 11. The data supplied from the ROM 10 as indicated by arrow 16 is also supplied to the memory tester 11. The memory tester compares the correct data from the data buffer memory with the data out from the ROM 10, and generates a pass/fail flag 17 to indicate whether the data was successfully stored in the ROM 10.

The approach of the prior art is satisfactory for smaller and slower ROM devices. However, as the size of the data set stored in the ROM increases, the size of the data buffer memory 12 also increases to a prohibitive degree. Furthermore, the testing equipment uses the same address as the ROM chip for accessing the data within the buffer memory 12. During a testing sequence, only one entry can be stored per address in the buffer memory 12. Thus, the tester cannot be used for testing ROMs with more than one data set in a single manufacturing sequence, regardless of the size of the buffer memory 12.

In addition, as the speed of the integrated circuit increases, noise problems encountered in the testing environment during transfer of the data from the ROM to the memory tester interfere with the successful testing of the devices. The testing speeds can be reduced in order to reduce the problem with the noise in the testing environment. However, slower testing with large data sets increases the time involved, and therefore significantly increases the cost of manufacturing.

Accordingly, it is desirable to provide an integrated circuit and a process which supports more efficient testing of data stored in the memory on the integrated circuit.

SUMMARY OF THE INVENTION

The present invention provides an integrated circuit with on chip resources to support the testing of data stored on the integrated circuit. In particular, logic is provided on the integrated circuit to compute a check code using data, or a combination of data and addresses, of a particular data set stored on the device. The check code is compared with a test code produced using a correct version of the particular data set, to indicate whether the particular data set was successfully stored on the device. In one embodiment, an on chip store, such as a ROM, a RAM, an EPROM or the like, is used to hold the code produced using the correct version, and an on chip comparator is used to produce a flag indicating the success or failure of the test. This way, during manufacturing of the device, the memory tester simply tests the flag. The test does not store the entire data set, and does not perform a comparison across the entire data set. Very large data sets, such as data greater than 100 Megabits (Mb), or greater than 500 Mb, can be manufactured and effectively tested in this manner. Also, very fast memory devices can be tested with the support of the on chip resources with some immunity from the noise of the testing environment.

In various embodiments, the check code is computed using a portion of the particular data set in the device, or all of the particular data set. In another embodiment, address logic is included on the integrated circuit, to produce the addresses used for producing the check code. Also in various embodiments, the logic used for computing the check code comprises a cyclic redundancy code generator, a hash function generator, a logical byte-wide or word-wide summing network, or other functional logic.

The structure of the present invention supports a method for manufacturing integrated circuits that include on chip memory. The method includes producing an integrated circuit, and computing the check code using on chip logic in response to data of the particular data set stored in the memory. The process further includes comparing the check code with a test code computed using a correct version of the particular data set. As mentioned before, the process may include storing a test code on the integrated circuit, and comparing the check sum with the test code using on chip logic.

In various embodiments, the process includes supplying the computed check sum to the memory tester, or supplying only the flag to the memory tester.

In another embodiment, the test code is stored on the integrated circuit, and resources are provided to allow an external device to read the test code. Thus, the test code may be utilized for the purposes of sorting integrated circuit die manufactured according to the present invention.

The present invention provides a method for manufacturing integrated circuits that comprises executing a sequence of processes to produce an integrated circuit die on a substrate, using a mask set having a plurality of reticles per mask for forming a corresponding plurality of die per mask, in which at least a first mask in the mask set defines a first data set, and at least a second mask in the mask set defines a second data set. In this manner, a single mask set can be used to produce integrated circuits having variant data sets stored thereon, in a single manufacturing run. On chip resources for storing a test code, and for producing a check code in response to data stored the die are provided. On chip logic is provided for comparing the check code to the test code to produce a signal indicating that valid data has been stored. During testing of integrated circuit, a step of checking the signal is used to verify that one of the first and second data sets stored on the device was successfully formed. Furthermore, the integrated circuit die may be sorted according to the stored test code.

In one embodiment, the integrated circuit comprises a mask ROM storing greater than 100 Mb of data, and more preferably greater than 500 Mb of data. In another embodiment, the integrated circuit comprises a processor including on chip code memory. In various embodiments, integrated circuits including on chip memory for a variety of applications include the self check resources of present invention.

Other aspects and advantages of the present invention can be seen upon review of the figures, the detailed description and the claims which follow.

DETAILED DESCRIPTION

A detailed description of embodiments of the present invention is provided with reference to FIG. 2 through FIG. 8.

Figure 2:
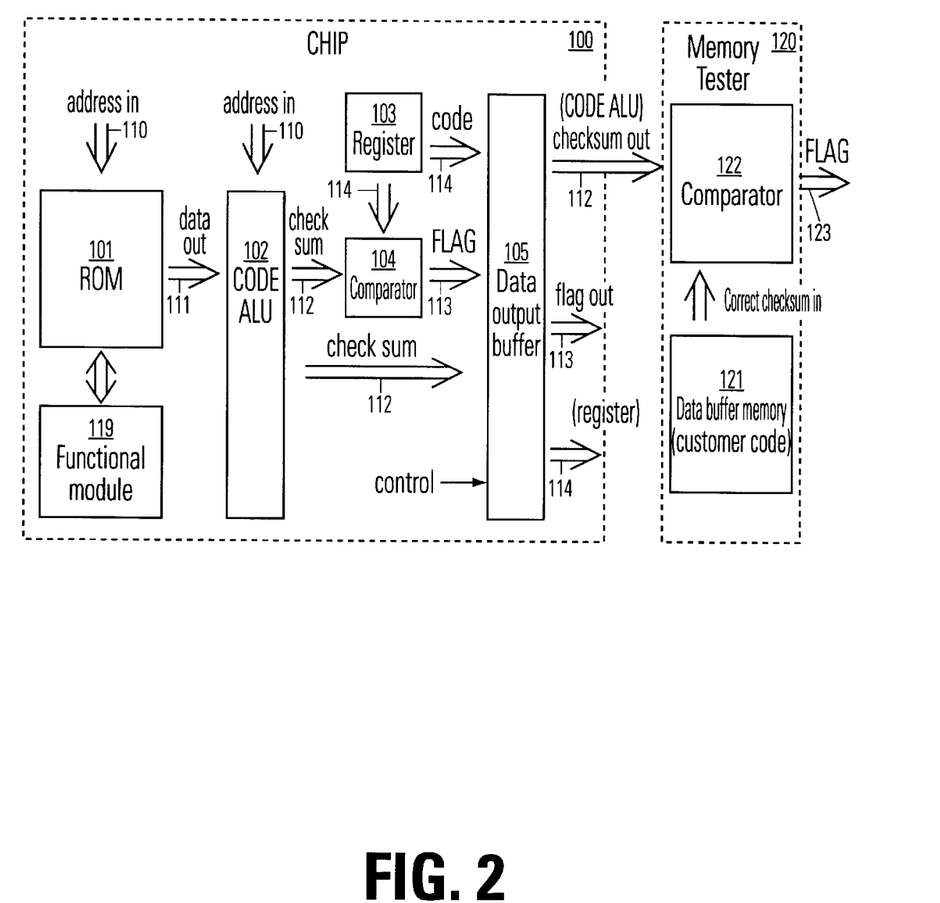
FIG. 2 is a block diagram of an integrated circuit with a memory tester according to the present invention.

FIG. 2 illustrates the basic components of an integrated circuit chip 100 according to the present invention. The integrated circuit 100 includes an array 101 of nonvolatile memory cells, such as a ROM, storing a particular data set. An arithmetic logic unit 102 is formed on the integrated circuit 100. In addition, a register 103 and a comparator 104 are provided on the chip 100. Also, a data output buffer 105 is provided on the chip 100. In order to test the data set in the array 101, addresses are supplied on line 110, and data is read out on line 111 into the arithmetic logic unit 102. In addition, in one embodiment the addresses 110 are also supplied as input to the arithmetic logic unit. The arithmetic logic unit 102 produces a checksum 112, and supplies it to the comparator 104. A test code is stored in the register 103, and supplied to comparator 104. The comparator produces a flag 113 in response to the comparison, and supplies the flag 113 to the data output buffer 105. In addition, the check sum 112 is supplied to the data output buffer 105. Finally, the test code in the register 103 is supplied to the data output buffer. Control logic on the chip is used to control the data output buffer 105 to supply one of the test code from the register 103, the flag from the comparator 104, or the checksum 112 from the arithmetic logic unit, as output. In one embodiment, the flag and/or the checksum are stored in a non-volatile store on the chip for later reading during die or wafer sorting.

As shown in FIG. 2, the output is applied to the memory tester 120. The memory tester may simply test of the flag 113, or read the check sum 112. In the case of the reading of the check sum, the data buffer memory 121 on the memory tester supplies a correct check sum to a comparator 122. The check sum 112 is compared in the comparator 122 to the correct check sum and a flag is produced as indicated at 123. In one embodiment, the test code 114 can be read by the memory tester 120. This embodiment, the test code is used as a signature for sorting the chip 100 according to the data stored in the memory array 101.

Also shown on the FIG. 2 is a functional module 119 in communication with the array 101. In various embodiments, the functional module 119 comprises a component of a "system on a chip," a digital signal processor, a RISC processor, a microcomputer core, or application specific logic which reads in the data set in connection with its processing mission. Accordingly, the structures and processes of the present invention to apply to integrated circuit memory devices, and to other devices having on chip memory combined with other circuitry.

Figure 3:
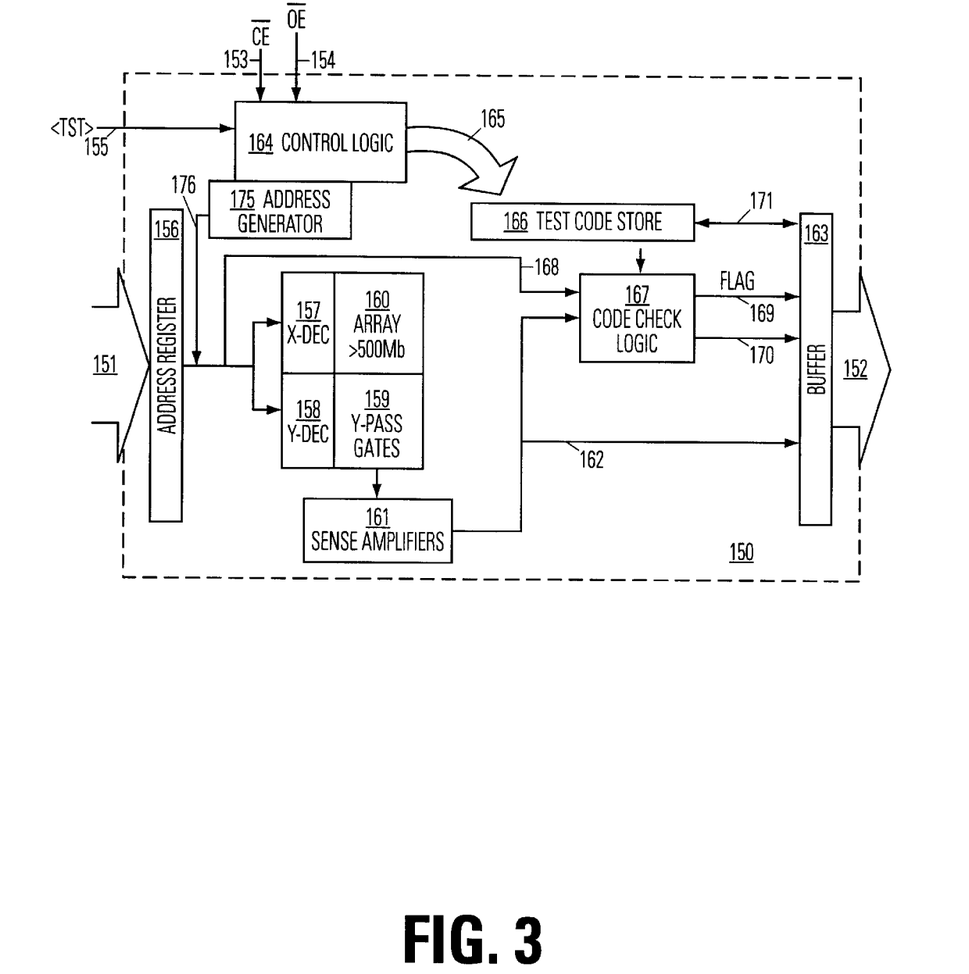
FIG. 3 is a block diagram of integrated circuit memory device according to the present invention.

FIG. 3 illustrates a read-only memory integrated circuit device 150 including the on chip resources supporting a testing of the data stored in the memory array. The integrated circuit device 150 has address inputs 151, and data outputs 152. Also, control signals such as a chip enable signal on line 153 and an output enable signal on line 154 are supplied to the chip. A test mode is initiated in response to test signals, heuristically indicated by line 155. The test signals may be independent inputs to the chip, or a combination of other inputs using a special format to cause entry of the test mode. The test signals are used during manufacturing to initiate a test sequence according to one embodiment of the present invention. In the device 150, the address inputs are supplied to an address register 156. The address register 156 supplies addresses to a row decoder 157 and to a column decoder 158. The column decoder 158 controls pass gates 159, which in combination with the outputs of the row decoder 157 address memory cells in the array 160. The array 160 comprises a large array of read-only memory cells storing a particular data set. In one embodiment of the invention, the array stores over 100 Mb, and more preferably over 500 Mb of data. Even greater amounts of data may be stored on devices including the resources of the present invention.

The pass gates 159 couple the array 160 to a set of sense amplifiers 161. The output of the sense amplifiers is supplied on line 162 to an output buffer 163. The output buffer 163 drives the output lines 152 in this embodiment. In an alternative embodiment, the output lines 152 may share pins on the integrated circuit device 150 with the address lines 151. Control logic 164 is responsive to the control signals to control various components of the device 150, as indicated by the arrow 165. According to the present invention, the device 150 also includes a register 166 storing a test code, and code check logic 167. The code check logic 167 is coupled to line 162 to receive the output of the sense amplifiers 161, and it is coupled to line 168 to receive the address signals from the address register 156. The code check logic 167 is responsive to the data on line 162 from the array to produce a check code. Also, the check code is compared with the test code from the register 166 to produce a flag on line 169 indicating success or failure of the test. In this embodiment, the code check logic 167 also supplies the check code on line 170 to the output buffer 163. Also, in this embodiment, the register 166 is coupled to the buffer 163 by line 171 by which the test code may be read by an external device. Also, in an embodiment using a register 166 implemented using a memory structure, such as a SRAM, which may be written, a test code may be stored into the register 166 by the external device during or before testing.

In the embodiment shown, an on chip address generator 175 is provided. The address generator 175 supplies addresses on line 176 automatically during the generation of the check code. The address generator 175 eliminates the need to supply addresses to the chip during the testing of the array 160.

The code check logic 167 uses the data, or a combination of data and addresses, to produce the check sum. The process can be controlled to produce a checksum using a portion, or all, of the data from the array. A special sequence of addresses may be used to access a pattern of data stored in the array. For example, an address sequence may be used which reads a column or selected columns from the array. Likewise, a sequence may be used which reads a row or selected rows from the array. A checker board pattern may also be read to produce the check sum. In one preferred embodiment, the entire array is used in the production of the check sum.

The test code register 166 acts as a store for the test code, against which the check sum produced by the code check logic of 167 is compared. The register 166 may be implemented using a mask ROM technique for storing the data. Other example alternatives include non-volatile floating gate memory, an array of fuses or laser cut devices, and SRAM.

Control logic associated with the buffer 163 and with the other on chip resources can be used to optionally supply the flag from line 169, the check sum from line 170, or the test code from line 171 to the memory tester, depending on the mode of operation of the device.

The memory tester can identify the chips which passed or failed in response to the flag on the chip. Alternatively, the memory tester's data buffer may be used as a secondary test code register. In this case, a partial check sum, or a check sum generated according to a special pattern can be tested. Also, the use of a memory tester's data buffer may eliminate the need for the on chip test code register, while retaining many of the benefits of the present invention. Furthermore, the memory tester may use the test code from line 171 as a silicon signature to identify the data stored on the device.

Figure 4:
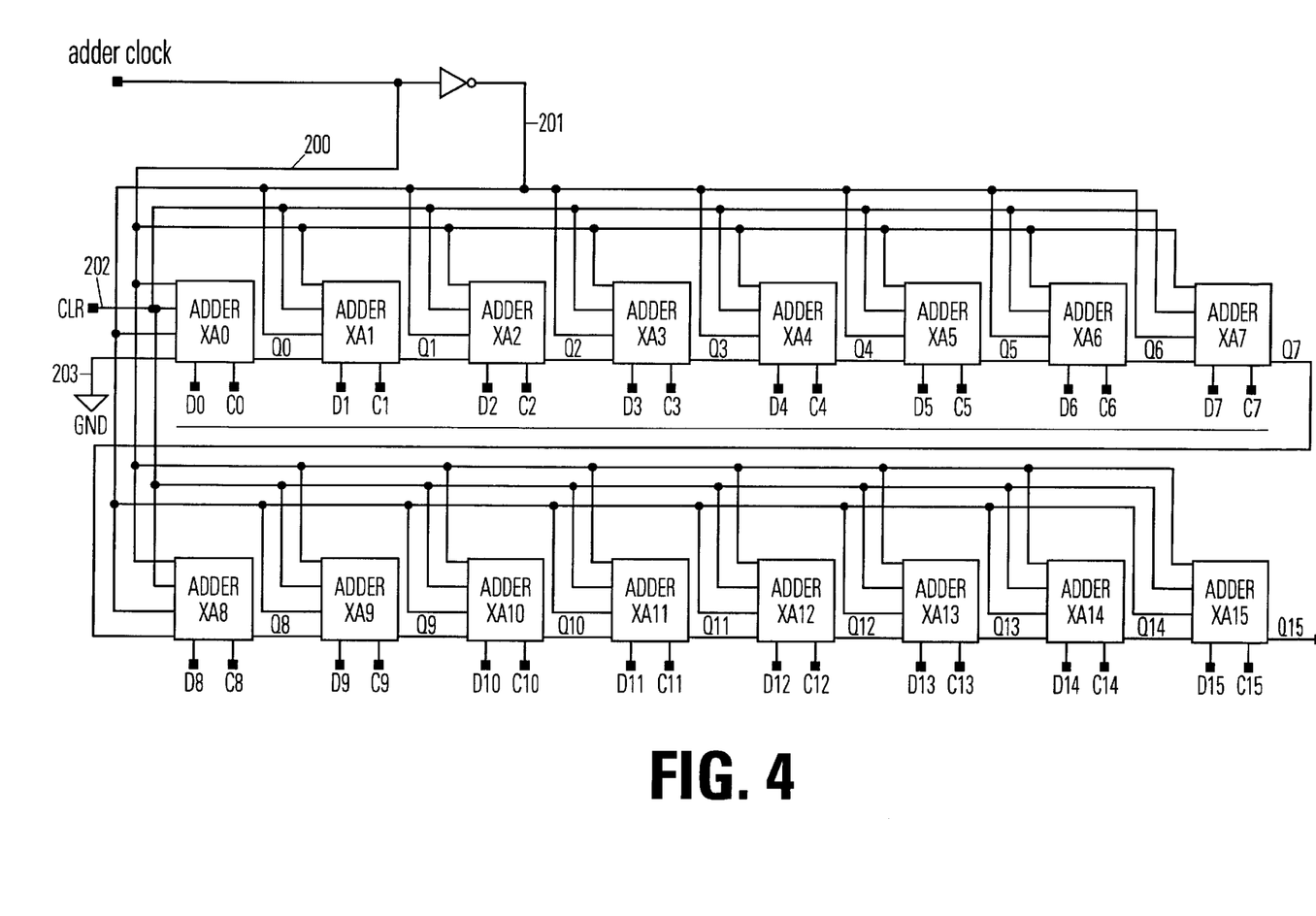
FIG. 4 is a schematic diagram of logic used for computing a checksum according to a particular embodiment of the present invention.
Figure 5:
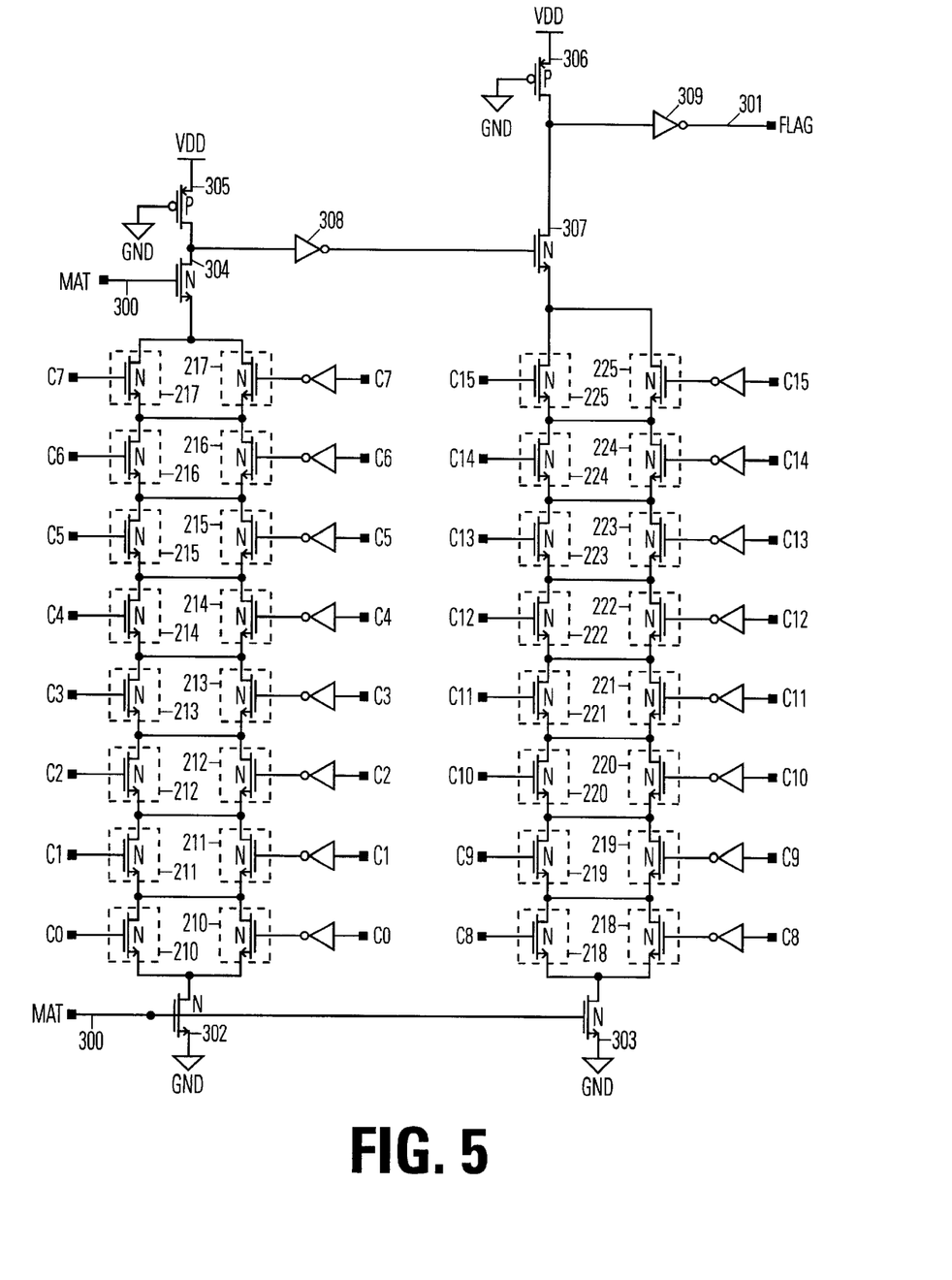
FIG. 5 is a schematic diagram of a comparator for use with the logic of FIG. 4.
Figure 6:
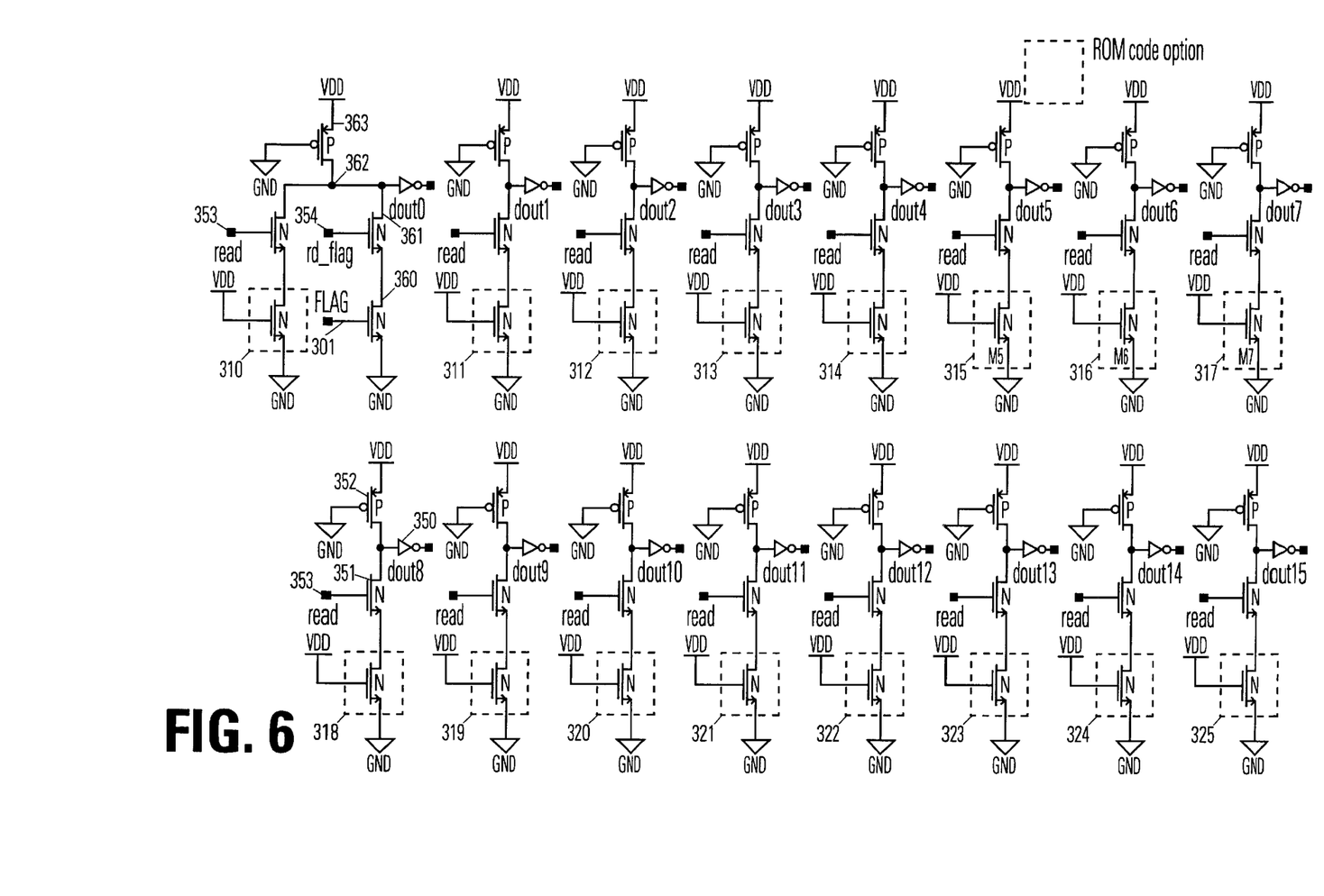
FIG. 6 is a schematic diagram of a mask ROM register for storing a test code for use with the logic of FIG. 4 and FIG. 5.

FIG. 4, FIG. 5, and FIG. 6 illustrate an example check sum generator, comparator and test code register according to one example embodiment of the present invention.

The check sum generator shown in FIG. 4 consists of a 16-bit adder, configured to accept a 16-bit wide word of data from the sense amplifiers for the ROM array, and adds each word sequentially to produce a final 16-bit check sum. Thus, the adder includes 16 stages XA0 to XA15. Each of the stages receives a true version of an adder clock and a complement version of the adder clock on lines 200 and 201 respectively. Also, each of the stages receives a clear signal on line 202. Stage XA0 has an input 203 coupled to ground, and an input coupled to the data bit D0. The output of stage XA0 is check sum bit C0. Stage XA0 has a carry output Q0 which is supplied as the input to the next stage, XA1. Stages XA1 through XA15 are connected in a similar fashion. Thus, the data word D0 through D15 is supplied sequentially as input and the check sum C0 through C16 is produced at the end of the addressing cycle.

FIG. 5 illustrates a comparator for use in combination with the check sum generator of FIG. 4. The comparator in FIG. 5 includes 16 pairs of mask ROM transistors 210 through 225. Each pair has its sources and drains coupled together, and mask ROM implants setting a bit of the test code. The gates of the respective pairs of transistors are connected to true and complement outputs respectively of the check sum generator. Thus the comparator in FIG. 5 acts as a test code store, as well as performing the logic function. A first stack of transistor pairs 210–217 is coupled to a pull down transistor 302. A pull up transistor 304, coupled with transistor 305 is connected at the top of the stack. The gates of transistors 304 and 302 are coupled to a control signal MAT. The gate of p-type transistor 305 is coupled to ground, holding it in an on state. The node between transistors 304 and 305 is coupled to the input of inverter 308. The output of the inverter 308 is connected to the transistor 307 which is coupled to the top of a second stack of transistor pairs 218–225. The bottom of the second stack is connected to the pull down transistor 303 which has its gate connected to be control signal MAT. A p-type transistor 306 is coupled to the drain of the transistor 307. Transistor 306 has its gate coupled to ground. The node between the transistor 306 and the transistor 307 is coupled to an inverter 309. The output of the inverter 309 is supplied on line 301 as the flag indicating the success or failure of the comparison.

FIG. 6 illustrates a mask ROM register for storing the test code, and for use in combination with the comparator of FIG. 5. The register includes 16 ROM cells 310–325, storing respective bits of the test code. Each cell, such as the cell coupled to ROM cell 318 includes an n-type transistor 351 and a p-type transistor 352. The gate of the p-type transistor 352 is connected to ground and the gate of the n-type transistor 351 is connected to a control signal on line 353 labeled "read". The node between the transistors 352 and 351 is connected to an inverter 350 which supplies a signal to the data output buffer for supply to external device.

The first memory cell in the register also includes a n-type transistor 360 coupled in series with n-type transistor 361 to a node 362. A p-type transistor 363 for the first ROM cell 310 is coupled between a node 362 and the supply potential. The gate of transistor 360 is connected to line 301 to receive the flag from the output of the comparator of FIG. 5. The gate of the transistor 361 receives a control signal indicating a reading of the flag labeled "rd_flag."

Accordingly, in a first mode, the data in the register ROM cells 310–325 is supplied to the data output buffer. In a second mode, the flag from line 301 to supplied to the data output buffer.

The example illustrated with respect to FIGS. 4–6 is implemented in a preferred embodiment of a high-density mask ROM chip. It enables the use of the test code as a silicon signature, and provides for generating a single bit flag indicating when the particular data set stored in the ROM is successfully written during manufacture.

Figure 7:
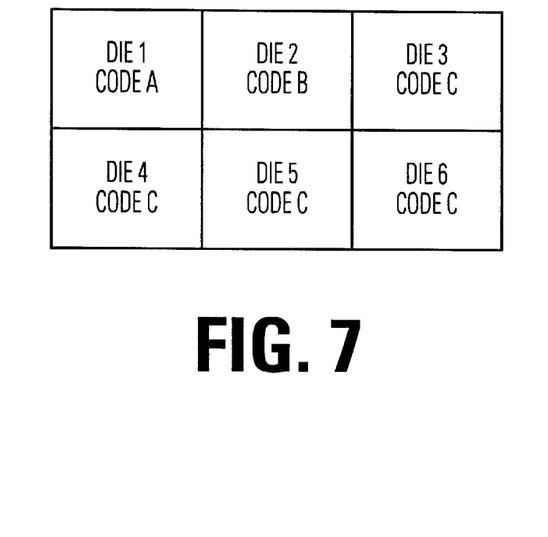
FIG. 7 is a simplified diagram of a mask having a plurality of the reticles defining different code sets for devices on a single wafer according to the present invention.
Figure 8:
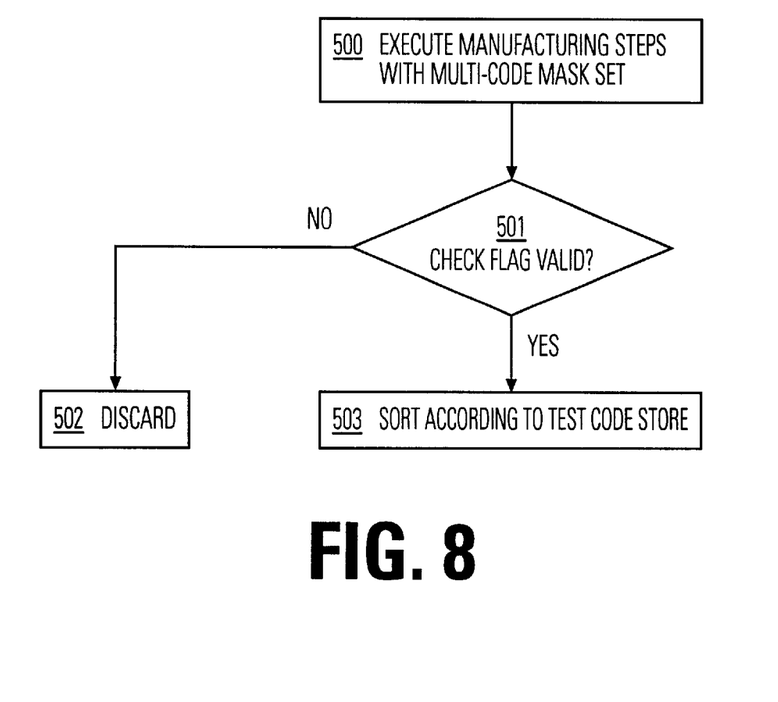
FIG. 8 is a simplified flow chart for a manufacturing process according to the present invention.

FIGS. 7 and 8 illustrate further features of the present invention in connection with manufacturing processes. FIG. 7 illustrates schematically a mask having six reticles for six corresponding die on a wafer being manufactured. In this embodiment, the data stored on the various die is one of three separate data sets labeled CODE A, CODE B and CODE C. Die 1 receives CODE A, die 2 receives CODE B and die 3, 4, 5 and 6 receive CODE C. With the present invention supplying on chip resources for producing a flag when the die successfully stores the particular data set, the testing and sorting of the integrated circuit manufactured with multiple code sets within a single manufacturing line is simplified. Thus, the process of FIG. 8 is enabled according to the present invention.

FIG. 8 illustrates a manufacturing process taking advantage of the testing procedures of present invention. The process begins with the step of executing manufacturing steps with a multi-code mask set, such as that described with reference to FIG. 7 (step 500). After the manufacturing steps, the memory test sequence is executed and a memory tester checks whether the flag is valid on the chip (step 501). If it is not, then the chip is discarded (step 502). If the check flag is valid at step 501, then the chip is sorted according to the test code store (step 503).

Accordingly, the present invention improves the efficiency of manufacturing and testing high-density read-only memory devices, and of other integrated circuits in which the testing of data sets stored in on chip nonvolatile memory can be improved. Also, the process of the present invention facilitates the manufacturing of devices, such as processors with embedded code, and special purpose memory devices, by enabling the implementation of multiple code sets in a single mask set. The sorting and testing of the various code sets is made possible using the on chip resources taught by the present invention.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the appended claims.

What is claimed is:

1. An integrated circuit, comprising:
    an integrated circuit substrate;
    an array of non-volatile memory cells on the integrated circuit substrate storing a particular data set; and
    logic on the integrated circuit, and responsive to test mode signals adapted to be applied during manufacturing testing of the integrated circuit, to compute a check code using the particular data set stored in the array.

2. The integrated circuit of claim 1, including:
    a store on the integrated circuit substrate storing a code computed using a correct version of the particular data set.

3. The integrated circuit of claim 1, including:
    a store on the integrated circuit substrate storing a code computed using a correct version of the particular data set; and
    logic on the integrated circuit substrate to produce a signal in response to comparison of the check code with the stored code.

4. The integrated circuit of claim 3, including a port on the integrated circuit substrate by which the signal is supplied to external devices.

5. The integrated circuit of claim 1, wherein the logic to compute a check code uses a portion of the particular data set.

6. The integrated circuit of claim 1, wherein the logic to compute a check code uses all of the particular data set.

7. The integrated circuit of claim 1, including a port on the integrated circuit substrate by which the check code is supplied to external devices.

8. The integrated circuit of claim 1, including:
    a set of non-volatile memory cells on the integrated circuit substrate storing a code computed using a correct version of the particular data set.

9. The integrated circuit of claim 1, including:
    a set of mask ROM cells on the integrated circuit substrate storing a code computed using a correct version of the particular data set.

10. The integrated circuit of claim 1, wherein the logic to compute a check code comprises:
    address logic to produce addresses for reading the particular data set from the array; and
    arithmetic logic for computing a checksum in response to the particular data set.

11. The integrated circuit of claim 1, wherein the logic to compute a check code comprises:
    arithmetic logic for computing a checksum in response to the particular data set.

12. The integrated circuit of claim 1, wherein the logic to compute a check code comprises:
    a cyclic redundancy code generator.

13. The integrated circuit of claim 1, wherein the logic to compute a check code comprises:
    a hash generator.

14. The integrated circuit of claim 1, including read logic which supplies the particular data set in response to addresses, and wherein the logic to compute a check code is responsive to the addresses.

15. The integrated circuit of claim 1, wherein the logic to compute a check code comprises:
    address logic to produce addresses for reading the particular data set from the array; and
    arithmetic logic for computing a checksum in response to the addresses and the particular data set.

16. The integrated circuit of claim 1, wherein the particular data set comprises more that 100 megabits of data.

17. The integrated circuit of claim 1, wherein the particular data set comprises more that 500 megabits of data.

18. A method for manufacturing an integrated circuit including memory storing a particular data set, comprising:
    producing the integrated circuit with a stored version of the particular data set in non-volatile memory on the integrated circuit and with computational logic on the integrated circuit;
    computing a check code using the computational logic in response to data of the stored version of the particular data set; and
    comparing the check code with a test code computed using a correct version of the particular data set, to signal that the particular data set is correct.

19. The method of claim 18, including:
    storing the test code on the integrated circuit, and comparing the check code with the test code using on-chip logic.

20. The method of claim 18, including:
    storing the test code on the integrated circuit, and comparing the check code with the test code using on-chip logic; and
    supplying a signal in response to comparison of the check code with the test code to an external device.

21. The method of claim 18, computing the check code based on a portion of the data of the particular data set.

22. The method of claim 18, computing the check code based on all of the data of the particular data set.

23. The method of claim 18, including:
    storing the test code in an on-chip set of non-volatile memory cells.

24. The method of claim 18, including:
    storing the test code in an on-chip set of mask ROM cells.

25. The method of claim 18, wherein computing the check code comprises:
    producing addresses for reading data of the particular data set; and
    computing a checksum in response to the read data.

26. The method of claim 18, wherein computing the check code comprises:
    computing a checksum in response to data of the particular data set.

27. The method of claim 18, wherein computing the check code comprises:
    computing a cyclic redundancy code in response to data of the particular data set.

28. The method of claim 18, wherein computing the check code comprises hashing data of the particular data set.

29. The method of claim 18, including read logic which supplies the particular data set in response to addresses, and wherein the logic to compute a check code is responsive to the addresses.

30. The method of claim 18, wherein computing a check code comprises:
producing addresses for reading data of the particular data set; and
computing a checksum in response to the addresses and data of the particular data set.

31. The method of claim 18, wherein the particular data set comprises more that 100 megabits of data.

32. The method of claim 18, wherein the particular data set comprises more that 500 megabits of data.

33. A method for manufacturing integrated circuits, comprising:
executing a sequence of processes to produce integrated circuit die on a substrate, using a mask set having a plurality of reticles per mask for forming a corresponding plurality of die per mask, at least one mask in the mask set having a first reticle having features defining a first data set stored on the die corresponding to the first reticle and at least a second reticle having features defining a second data set stored on the die corresponding to the second reticle;
the mask set further defining a store on the die for storing a check code and defining logic for producing a code in response to the data set stored on the die, and comparing the code to the check code to produce a signal in response to the comparison; and
during testing of the integrated circuit die produced, checking the signal to verify that one of the first and second data sets was successfully formed on the integrated circuit die.

34. The method of claim 33, including:
sorting the integrated circuit die according to the stored check code.

35. A method for sorting integrated circuits, comprising:
storing a code on the integrated circuit produced in response to a correct version of data stored in the integrated circuit as a stored version of said data;
computing a check code in response to said stored version;
comparing said check code with said stored code to verify said stored version; and
reading said stored code to identify the integrated circuit during sorting.

36. An integrated circuit, comprising:
an integrated circuit substrate;
an array of non-volatile memory cells on the integrated circuit substrate storing a particular data set;
logic on the integrated circuit, and responsive to test mode signals adapted to be applied during manufacturing testing, to compute a check code using the particular data set stored in the array; and
a port on the integrated circuit substrate by which the check code is supplied to external devices.

37. An integrated circuit, comprising:
an integrated circuit substrate;
an array of non-volatile memory cells on the integrated circuit substrate storing a particular data set;
logic on the integrated circuit, and responsive to test mode signals adapted to be applied during manufacturing testing, to compute a check code using the particular data set stored in the array; and
read logic which supplies the particular data set in response to addresses,
wherein the logic to compute a check code is responsive to the addresses.

38. An integrated circuit, comprising:
an integrated circuit substrate;
an array of non-volatile memory cells on the integrated circuit substrate storing a particular data set; and
logic on the integrated circuit, and responsive to test mode signals adapted to be applied during manufacturing testing, to compute a check code using the particular data set stored in the array,
wherein the logic to compute a check code comprises:
address logic to produce addresses for reading the particular data set from the array; and
arithmetic logic for computing a checksum in response to the addresses and the particular data set.

39. A method for manufacturing an integrated circuit including memory storing a particular data set, comprising:
producing the integrated circuit with a stored version of the particular data set in non-volatile memory on the integrated circuit;
computing a check code using on-chip logic in response to data of the stored version of the particular data set;
comparing the check code with a test code computed using a correct version of the particular data set, to signal that the particular data set is correct; and
read logic which supplies the particular data set in response to addresses,
wherein the logic to compute a check code is responsive to the addresses.

40. A method for manufacturing an integrated circuit including memory storing a particular data set, comprising:
producing the integrated circuit with a stored version of the particular data set in non-volatile memory on the integrated circuit;
computing a check code using on-chip logic in response to data of the stored version of the particular data set; and
comparing the check code with a test code computed using a correct version of the particular data set, to signal that the particular data set is correct,
wherein computing a check code comprises:
producing addresses for reading data of the particular data set; and
computing a checksum in response to the addresses and data of the particular data set.

* * * * *